(12) United States Patent
Leobandung (10) Patent No.: US 11,789,069 B2
(45) Date of Patent: Oct. 17, 2023

(54) MIXED HIGH-RESOLUTION AND LOW-RESOLUTION INSPECTION FOR TAMPER DETECTION

(71) Applicant: International Business Machines Corporation, Armonk, NY (US)

(72) Inventor: Effendi Leobandung, Stormville, NY (US)

(73) Assignee: INTERNATIONAL BUSINESS MACHINES CORPORATION, Armonk, NY (US)

(*) Notice: Subject to any disclaimer, the term of this patent is extended or adjusted under 35 U.S.C. 154(b) by 28 days.

(21) Appl. No.: 17/541,708

(22) Filed: Dec. 3, 2021

(65) Prior Publication Data
US 2023/0176117 A1    Jun. 8, 2023

(51) Int. Cl.
  *G01R 31/28* (2006.01)
  *G01R 31/311* (2006.01)
  *G06N 20/00* (2019.01)

(52) U.S. Cl.
  CPC ........ *G01R 31/311* (2013.01); *G01R 31/2853* (2013.01); *G06N 20/00* (2019.01)

(58) Field of Classification Search
  CPC .. G01R 31/311; G01R 31/2853; G06N 20/00; G06F 21/86; G06F 21/88; G06F 21/73; H01L 21/67063; H01L 23/544; H01L 21/67294; H01L 22/20; H01L 23/57; H01L 2223/544
  USPC .................................................. 324/754.23
  See application file for complete search history.

(56) References Cited

U.S. PATENT DOCUMENTS

| | | | |
|---|---|---|---|
| 5,940,545 | A | 8/1999 | Kash et al. |
| 2011/0026806 | A1* | 2/2011 | Bernstein ............. G01R 31/311 382/145 |
| 2017/0131350 | A1 | 5/2017 | Song et al. |
| 2021/0383530 | A1* | 12/2021 | Peleg ....................... G06T 7/11 |

OTHER PUBLICATIONS

Comelli et al. "Analyzing integrated circuits at work with a picosecond time-gated imager." Optics express 13.25 (2005): 10075-10084.
Oberai et al. "Smart E-beam for defect identification & analysis in the nanoscale technology nodes: technical perspectives." Electronics 6.4 (2017): 87.
Tobin, "Inspection in semiconductor manufacturing." Webster's Encyclopedia of Electrical and Electronic Engineering 10 (1999): 242-262.

* cited by examiner

*Primary Examiner* — Jermele M Hollington
*Assistant Examiner* — Courtney G McDonnough
(74) *Attorney, Agent, or Firm* — Cantor Colburn LLP; Samuel Waldbaum (57) ABSTRACT

Embodiments of the invention include a computer-implemented method that includes controlling, using a processor, a high-resolution optical inspection tool (HROIT) to identify a reference die tamper circuit on a reference die of a wafer; and controlling, using the processor, a low-resolution optical inspection tool (LROIT) to use the reference die tamper circuit to determine that the reference die tamper circuit is on a second die of the wafer.

20 Claims, 8 Drawing Sheets

MIXED HIGH-RESOLUTION AND LOW-RESOLUTION INSPECTION FOR TAMPER DETECTION

BACKGROUND

The present invention relates in general to the fabrication, packaging, and inspection of integrated circuits (ICs) formed on chip regions of a semiconductor wafer. More specifically, the present invention relates to inspection systems configured to implement mixed high-resolution and low-resolution wafer inspection techniques configured and arranged to detect tamper circuitry that has been intentionally added to the IC chip during outsourced fabrication.

IC fabrication processes include the use of patterned masks to define and form the various devices (e.g., transistors) of the IC. IC layouts or mask designs represent an IC in terms of planar geometric shapes, which correspond to the patterns of metal, oxide, or semiconductor layers that make up the components of the IC. In general, where standard and well-controlled fabrication processes are used, the behavior of the final IC depends largely on the positions and interconnections of the geometric shapes.

A computer-aided layout tool can be used to generate the IC layout that places and connects all of the components that make up each IC chip such that it meets certain criteria, including, for example, performance, size, density, and manufacturability. The generated layout must pass a series of checks in a process known as physical verification. When all verification is complete, layout post-processing is applied where the IC layout is translated into data (e.g., an industry-standard format, typically GDSII) and sent to a semiconductor foundry. The foundry converts the data into mask data and uses it to generate the masks used in a photolithographic process of semiconductor device fabrication.

SUMMARY

Embodiments of the invention include a computer-implemented method that includes controlling, using a processor, a high-resolution optical inspection tool (HROIT) to identify a reference die tamper circuit on a reference die of a wafer; and controlling, using the processor, a low-resolution optical inspection tool (LROIT) to use the reference die tamper circuit to determine that the reference die tamper circuit is on a second die of the wafer.

Embodiments of the invention include a computer system and a computer program product having substantially the same features as the computer-implemented method described above.

Additional features and advantages are realized through the techniques described herein. Other embodiments and aspects are described in detail herein. For a better understanding, refer to the description and to the drawings.

BRIEF DESCRIPTION OF THE DRAWINGS

The subject matter which is regarded as the present invention is particularly pointed out and distinctly claimed in the claims at the conclusion of the specification. The foregoing and other features and advantages are apparent from the following detailed description taken in conjunction with the accompanying drawings in which:

In the accompanying figures and following detailed description of the disclosed embodiments, the various elements illustrated in the figures are provided with three or four digit reference numbers.

DETAILED DESCRIPTION

For the sake of brevity, conventional techniques related to IC chip fabrication may or may not be described in detail herein. Moreover, the various tasks and process steps described herein can be incorporated into a more comprehensive procedure or process having additional steps or functionality not described in detail herein. In particular, various steps in the fabrication of semiconductor devices and semiconductor-based ICs are well known and so, in the interest of brevity, many conventional steps will only be mentioned briefly herein or will be omitted entirely without providing the well-known process details.

Similarly, conventional techniques related to making and using aspects of the invention may or may not be described in detail herein. In particular, various aspects of computing systems (or processors, or processor systems) and specific computer programs to implement the various technical features described herein are well known. Accordingly, in the interest of brevity, many conventional implementation details are only mentioned briefly herein or are omitted entirely without providing the well-known system and/or process details.

So-called "fabless" companies design and sell hardware devices and packaged IC chips while outsourcing their fabrication to a specialized manufacturer called a semiconductor foundry or an outsourced semiconductor foundry. These foundries are typically, but not exclusively, located in different country than the fabless company. Fabless companies can benefit from lower capital costs while concentrating their research and development resources on the end market.

Sending an IC chip design to a semiconductor foundry to be fabricated exposes the IC chip design to potential tampering. Unauthorized and relatively simple "tamper circuits" that deviate from fabless company's IC design can be added to the IC design at the contractor semiconductor foundry without the IC design owner's (i.e., the fabless company's) consent or knowledge. For example, tamper circuits can be as simple as a counter circuit that acts as a disable-switch that can be activated to, without authorization, disable the IC chip after it has been packaged, sold, and is in-use. Accordingly, to detect unauthorized tampering, fabless companies need inspection processes to ensure that every level of every IC chip received from a contracted semiconductor foundry matches the original IC chip design.

Wafer inspection tools are conventionally used to find defects on a wafer, and this task is becoming more challenging and costly at each node due to process shrinks, design complexities, and new materials. In a known wafer inspection process, a wafer inspection tool takes a photo of a first die; takes a photo of a second die; and compares the photos to identify differences between the photo images. These differences can be characterized, at least initially, as a defect or a potential defect in the wafer.

With continued decreases in the size of functional elements in ICs, using wafer inspection tools to reliably identify tamper circuits requires high-resolution inspection techniques in order to detect very small tamper circuits that can, in some situations, be buried deep within the multiple layers of the fabricated IC chip. However, known high-resolution optical inspection techniques (e.g., electron beam) are impractical to use for inspecting every level of every IC chip received from a contracted semiconductor foundry because high-resolution optical inspection techniques take a very long time to complete (e.g., several weeks per wafer).

Turning now to an overview of aspects of the present invention, embodiments of the invention provide novel fabricated IC wafer inspection systems configured to implement mixed high-resolution and low-resolution wafer inspection techniques configured and arranged to detect tampering circuits that have been intentionally added to the chips or die an IC wafer during outsourced fabrication. In embodiments of the invention, a reference die on the fabricated IC wafer is randomly selected and analyzed using IC design pattern comparison tools and high-resolution optical analysis/comparison tools (e.g., e-beam analysis system) to identify differences between the functional elements of the IC design pattern and the functional elements that are actually present on the reference die of the fabricated IC wafer. These differences could be defects or could be tamper circuits, so they are initially identified as a set of "tamper candidates," and information of the "tamper candidates" is stored (e.g., images of the tamper candidates; the location (e.g., position coordinates and wafer level) of the tamper candidate on the chip/die; etc.).

In accordance with aspects of the invention, additional analysis is applied to determine whether the tamper candidates are defects or tamper circuits. In some embodiments of the invention, the additional analysis is applied using machine learning algorithms trained to perform the task of determining (or "classifying") whether any of the tamper candidates match a known working circuit. The tamper candidates that the machine learning algorithm classifies as working circuits are also classified as tamper circuits and the stored information of the tamper candidates is updated to reflect the tamper candidates that have been identified as tamper circuits. The tamper candidates that the machine learning algorithm classifies as not being working circuits are classified as defects and the stored information of the tamper candidates is updated to reflect the tamper candidates that have been identified as defects. In some embodiments of the invention, the additional analysis is applied by controlling the high-resolution optical tool to move to the same location on a next die of the wafer and determine whether or not the same "reference die" tamper candidate is at the same location on the next die. If the same "reference die" tamper candidate is at the same location on the next die, the tamper candidate is determined to be a tamper circuit and the stored information of the tamper candidates is updated to reflect the tamper candidates that have been identified as tamper circuits. If the same "reference die" tamper candidate is not at the same location on the next die, the tamper candidate is determined to be a defect and the stored information of the tamper candidates is updated to reflect the tamper candidates that have been identified as defects.

In embodiments of the invention, a low-resolution optical tool (e.g., a 193 nm-based optical inspection tool) compares the information of the reference die tamper circuits to the other dies on the wafer, as well as any die on any other wafer that uses the same IC design. Any match between the information of the reference die tamper circuits and the die-under-analysis can be flagged as a potential tamper circuit. In some embodiments of the invention, additional analysis can be applied to the flagged match to confirm or reject the determination that the flagged match is a tamper circuit. Because this portion of the computer-controlled analysis is performed with a relatively fast low-resolution optical tool, the inspection of one wafer can be completed as fast as about 30 minutes. In accordance with aspects of the invention, a computer-controlled wafer inspection technique is provided that uses a novel mix of high-resolution optical inspection and low-resolution optical inspections. Because the slower high-resolution portion of the computer-controlled analysis is applied to one die of one wafer of the IC design, and because the slower high-resolution analysis results are leveraged in the faster low-resolution portions of the computer-controlled process, the faster low-resolution portion of the computer-controlled process can be applied to all other die and/or wafers of the IC design, thereby decreasing overall inspection time while providing the high-resolution circuit detection.

Accordingly, although the above-described computer-controlled methodology uses high-resolution optical tools, the high-resolution optical tools are primarily focused on one reference die of the wafer, and the data generated by the high-resolution optical tool is leveraged by a low-resolution optical tool to perform a faster analysis on the remaining die on the wafer. Accordingly, the novel mixed high-resolution and low-resolution optical techniques and tools can be used, in accordance with embodiments of the invention, to accomplish accurate tamper circuit detection in significantly less time than using known high-resolution inspection techniques and tools to inspect an entire wafer.

Figure 1:
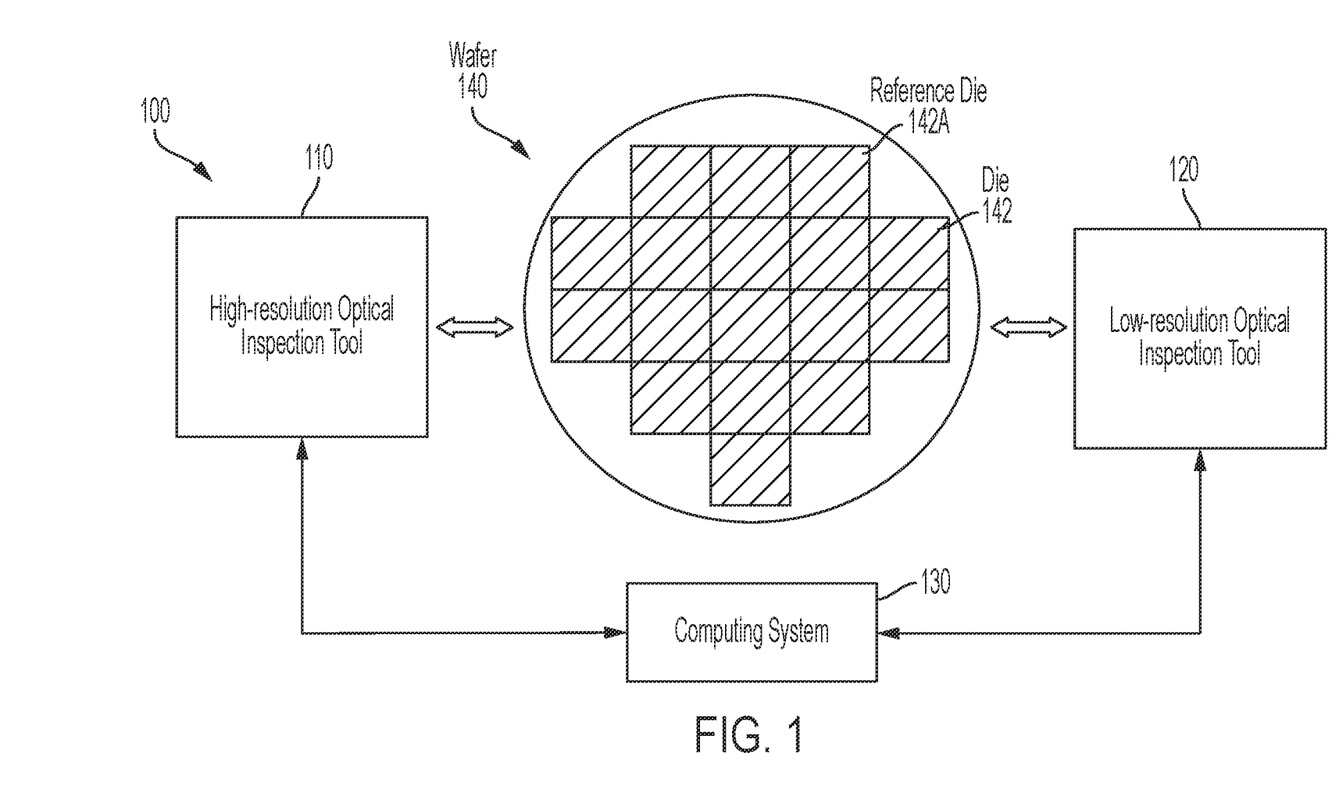
FIG. 1 depicts a simplified block diagram illustrating a mixed high-resolution, low-resolution (HRLR) system in accordance with embodiments of the invention.

FIG. 1 depicts a simplified block diagram illustrating a mixed high-resolution, low-resolution (HRLR) system 100 in accordance with embodiments of the invention. The HRLR system 100 includes a high-resolution optical inspection tool (HROIT) 110, a low-resolution optical inspection tool (LROIT) 120 and a computing system 130, configured and arranged as shown. The HRLR system 100 is configured to perform optical inspections of a fabricated wafer 140. In some embodiments of the invention, the fabricated wafer 140 has been fabricated by an outsourced semiconductor foundry using an IC design provided by a fabless company.

The fabricated wafer 140 is depicted in FIG. 1 as a top-down view. In accordance with embodiments of the invention, the fabricated wafer 140 can be inspected by the HROIT 110 and/or the LROIT 120 under control of the computing system 130. The wafer includes a plurality of dies (or chips) 142, at least one of which is used as a reference die 142A used in accordance with aspects of the invention. The fabricated wafer 140 includes a substrate (not shown separately), which can be made of any suitable substrate material, such as, for example, monocrystalline Si, silicon germanium (SiGe), III-V compound semiconductor, II-VI compound semiconductor, or semiconductor-on-insulator (SOI). The fabricated wafer 140 further includes front-end-of-line (FEOL), middle-of-line (MOL), and back-endof-line (BEOL) structures (not shown separately) formed in FEOL, MOL, and BEOL regions (not shown separately) of the fabricated wafer 140.

In general, semiconductor wafers such as the fabricated wafer 140 are fabricated in a series of stages, including a FEOL stage, a MOL stage, and a BEOL stage. The process flows for fabricating modern semiconductor wafers are often identified based on whether the process flows fall in the FEOL stage, the MOL stage, or the BEOL stage. Generally, the FEOL stage is where device elements (e.g., transistors, capacitors, resistors, etc.) are patterned in the semiconductor substrate/wafer. The FEOL stage processes include wafer preparation, isolation, gate patterning, and the formation of wells, source/drain (S/D) regions, extension junctions, silicide regions, and liners. The FEOL stage processes also involve the formation of a plurality of IC chips or die on the surface of a semiconductor wafer. Each IC chip/die contains circuits formed by electrically connecting active and passive components. The MOL stage typically includes process flows for forming interconnect structures (e.g., lines, wires, metal-filled vias, contacts, and the like) that communicatively couple to active regions (e.g., gate, source, and drain) of the device element. During the BEOL stage, layers or levels of interconnect structures are formed above these logical and functional levels to complete the semiconductor wafer. Most semiconductor wafers need more than one level of interconnects to form all the necessary connections, and as many as 5-12 levels are added in the BEOL process. A final semiconductor wafer fabricated in the above-described manner can include more than 50 thoroughly aligned lithographic levels.

Figure 7:
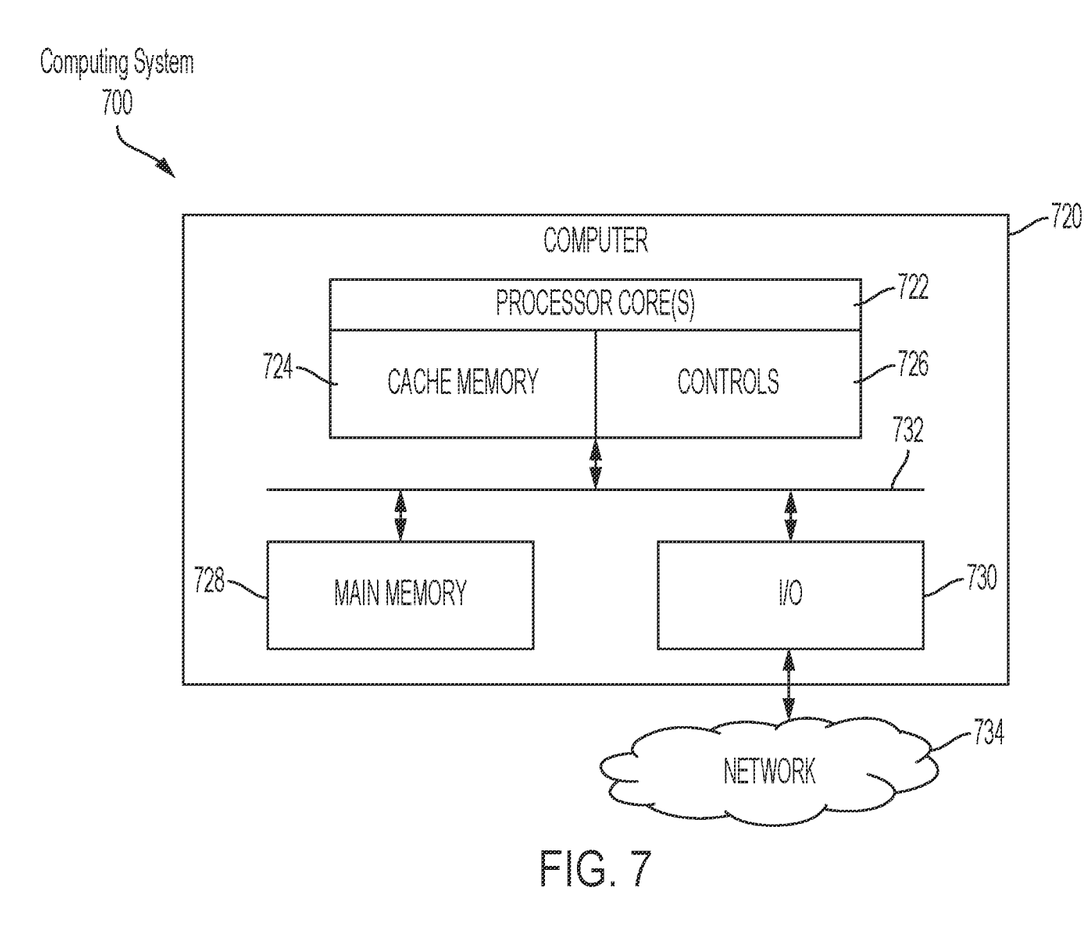
FIG. 7 depicts details of an exemplary computing system configured to implement various aspects of the invention.

In embodiments of the invention, the computing system 130 can be implemented as computing system 700 shown in FIG. 7. The computing system 130 can be configured and arranged to control the HROIT 110 and the LROIT 120 to perform the operations depicted in a computer-implemented method 200 shown in FIG. 2. Additional details the computer-implemented method 200 are described below in connection with the description of FIG. 2.

In some embodiments of the invention, the HROIT 110 can be implemented as an e-beam inspection system, which can include an electron gun, column, detectors, and a wafer stage. In operation, a wafer (e.g., fabricated wafer 140) is placed in the e-beam inspection system. The electron gun generates electrons that travel down the column, and the stage moves the wafer to a given location. Electrons hit a small part on a die (e.g., reference die 142A), which creates an image of the die. The e-beam inspection system generates two types of electrons, secondary or backscattered, to help identify details of functional elements (e.g., conductive lines, conductive vias, transistors, capacitors, resistors, and the like) in the wafer, as well as the location (e.g., positional coordinates and/or wafer level) of such details. Secondary electrons are low-energy electrons, which bounce back from a sample and provide surface information. Backscattered electrons penetrate deeper into the sample. The throughput of an e-beam inspection system is measured in $mm^2$ per hour.

In some embodiments of the invention, the LROIT 120 can be implemented as a 193 nm-based optical inspection system. A typical 193 nm-based optical inspection system uses a broadband light source to illuminate the wafer (e.g., fabricated wafer 140). As the wafer passes under imaging optics, a semiconductor device image is built up line by line. The optical inspection system used to image a semiconductor device is designed to enhance various detail of the wafer surface prior to analysis. Bright-field (BF) and dark-field (DF) imaging are used to improve contrast between different materials and topology respectively, e.g., due to absorption and scattering or due to surface texture. In BF imaging, the illumination path is coincident with the viewing path. Contrast in a BF image is a strong function of light attenuation and reflection between differing materials. Contrast in DF imaging, on the other hand, is a result of indirect illumination such that none of the light rays will be collected by the imaging optics unless scattered by an edge or a textured surface. The light is collected and an image is digitized, which identifies details of functional elements (e.g., conductive lines, conductive vias, transistors, capacitors, resistors, and the like) in the wafer, as well as the location (e.g., positional coordinates and/or wafer level) of such details. The throughput of 193 nm-based optical inspection systems is measured in wafers per hour.

Figure 2:
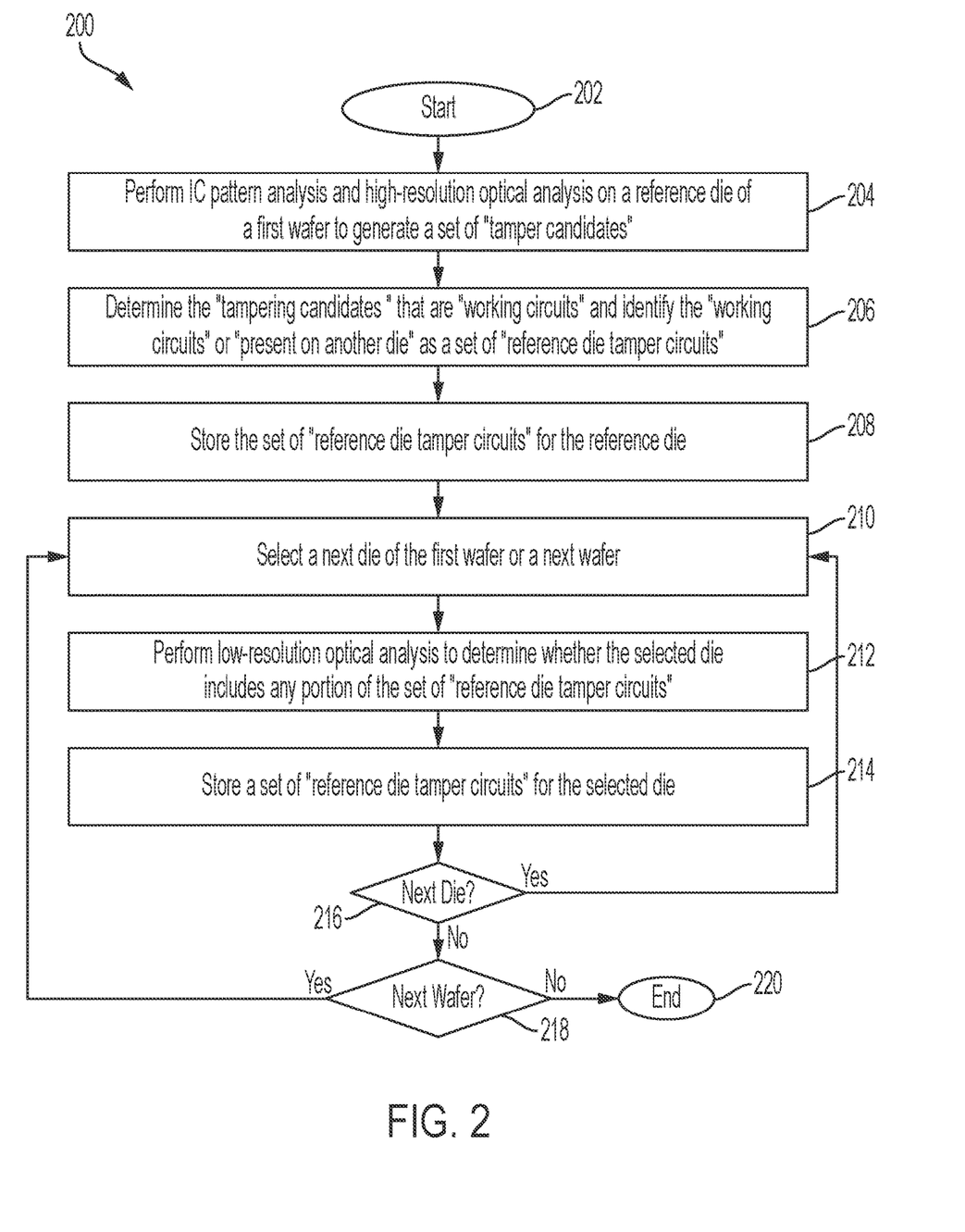
FIG. 2 depicts a flow diagram illustrating a methodology according to embodiments of the invention.

FIG. 2 depicts the computer-implemented method 200 in accordance with embodiments of the invention. The computer-implemented method 200 is performed by the computing system 130 (shown in FIG. 1). In some embodiments of the invention, the computing system 130 can include a classifier (e.g., classifier system 500 and classifier 510 shown in FIG. 5) having machine learning algorithms configured and arranged to perform selected tasks of the computer-implemented method 200.

Figure 3A:
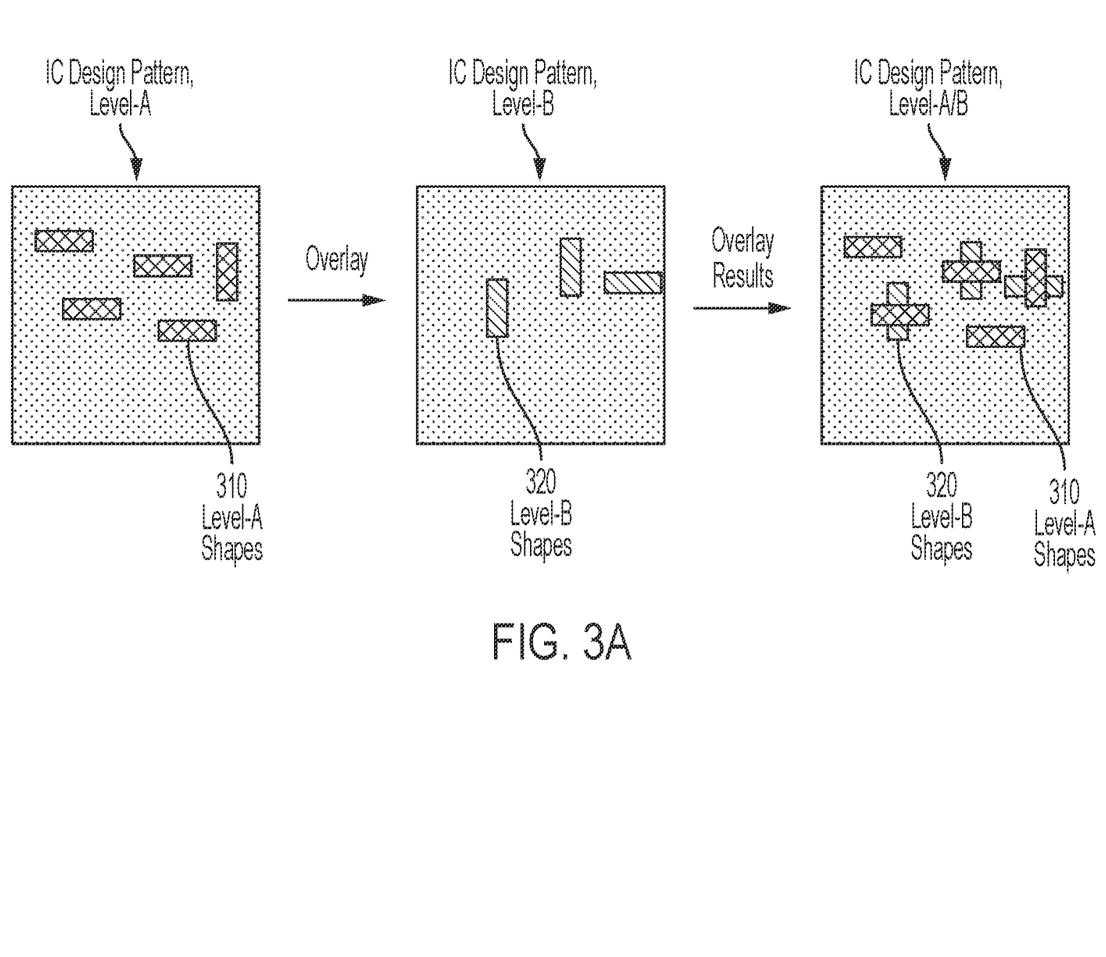
FIG. 3A depicts a simplified block diagram illustrating how aspects of the methodology shown in FIG. 2 can be performed.
Figure 3B:
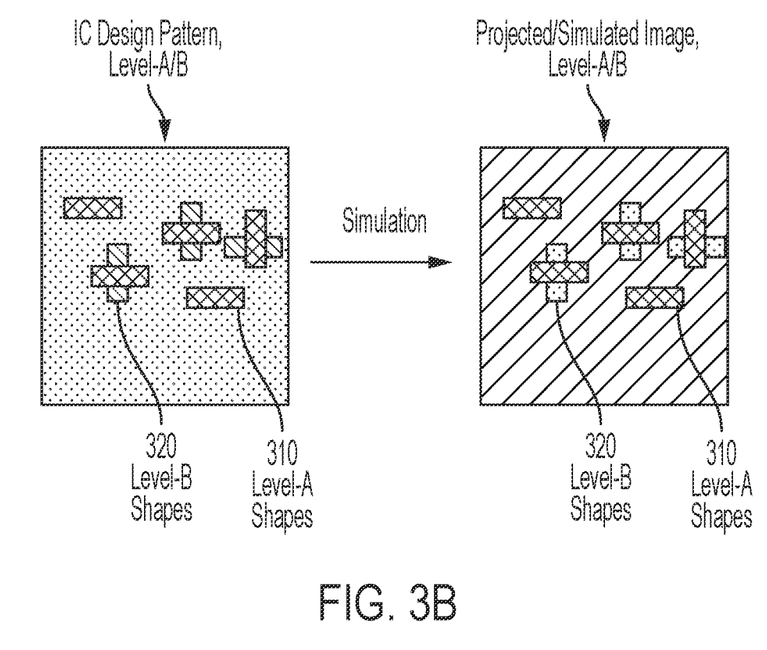
FIG. 3B depicts a simplified block diagram illustrating how aspects of the methodology shown in FIG. 2 can be performed.
Figure 4:
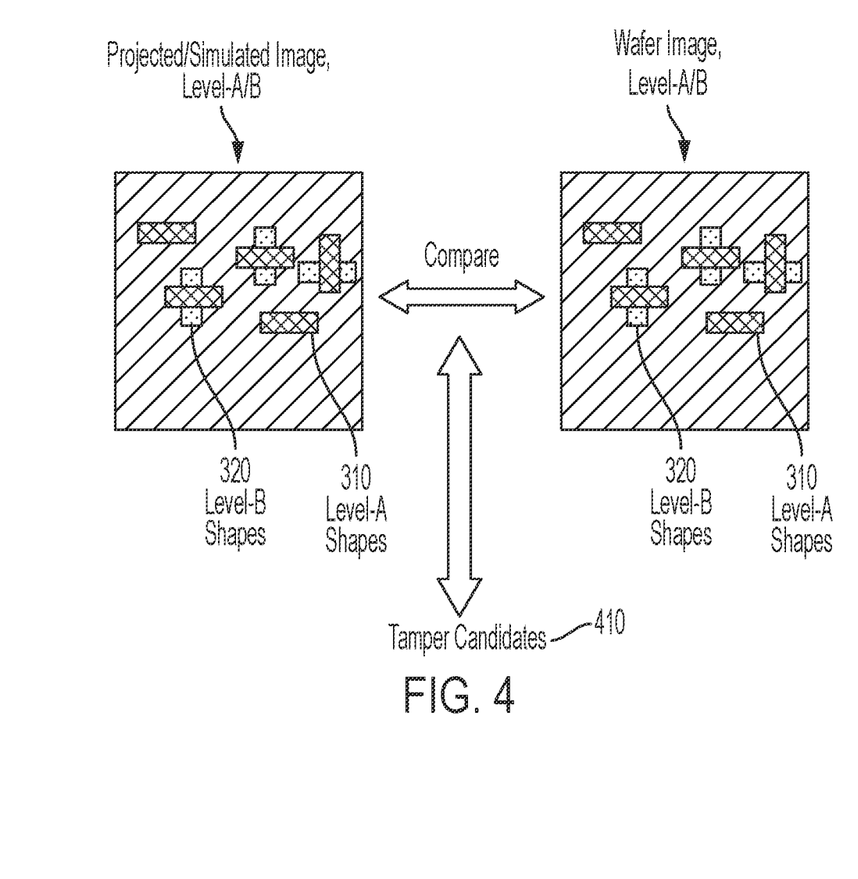
FIG. 4 depicts a simplified block diagram illustrating how aspects of the methodology shown in FIG. 2 can be performed.

The computer-implemented method 200 starts at block 202 then moves to block 204 to perform IC pattern analysis and high-resolution optical analysis on the reference die 142A of the fabricated wafer 140 to generate a set of tamper candidates 410 (shown in FIG. 4). Examples of how the IC pattern analysis and the high-resolution optical analysis can be performed in accordance with some embodiments of the invention are depicted in FIG. 3A, FIG. 3B, and FIG. 4.

FIG. 3A illustrates an initial phase of the IC pattern analysis in which the various levels of the IC design pattern of the fabricated wafer 140 are overlaid with one another. For ease of illustration, FIG. 3A illustrates a comparison (or overlay) between an image of a first level of the IC design pattern (IC Design Pattern, Level-A), which is identified as Level-A, and an image of a second level of the IC design pattern (IC Design Pattern, Level-B), which is identified as Level-B. Level-A and Level-B are adjacent to one another. It is understood that the operations depicted in FIGS. 3A, 3B, and 4 are applied to all adjacent levels of the IC design pattern and the fabricated wafer 140.

As depicted in FIG. 3A, the IC Design Pattern, Level-A includes Level-A shapes 310, which represent details of functional elements (e.g., conductive lines, conductive vias, transistors, capacitors, resistors, and the like) at Level-A of the IC design pattern. Similarly, the IC Design Pattern, Level-B includes Level-B shapes 320, which represent details of functional elements (e.g., conductive lines, conductive vias, transistors, capacitors, resistors, and the like) at Level-B of the IC design pattern. The IC Design Pattern, Level-A is overlaid with the IC Design Pattern, Level-B to generate overlay results, which are shown in FIG. 3A as IC Design Pattern, Level-A/B depicting an image of the Level-A shapes 310 overlaid on the Level-B shapes 320.

In FIG. 3B, simulation algorithms (e.g., computer-aided design algorithms) of the computing system 130 are used to simulate how the functional elements at Level-A and Level-B of the IC Design Pattern, Level-A/B interact with one another, and these interactions are represented in a Projected/simulated Image, Level-A/B. Because optical inspection light will interact with both levels A & B, the optical simulation will provide more accurate images for comparison with the reference die 142A.

In FIG. 4, the HROIT 110 is used to apply to Level-A and Level-B of the reference die 142A substantially the same operations that computing system 130 applied to the corresponding Level-A and Level-B of the IC design pattern in FIGS. 3A and 3B, thereby generating a Wafer Image, Level-A/B. The computing system 130 (and/or the HROIT 110) is used to compare the Projected/simulated Image, Level-A/B to the Wafer Image, Level-A/B to identify differences between the Projected/simulated Image, Level-A/B and the Wafer Image, Level-A/B. In accordance with aspects of the invention, the differences are identified as tamper candidates 410, and information of the tamper candidates 410 is stored. In accordance with aspects of the invention, the information of the tamper candidates 410 includes, for example, the Wafer Image, Level-A/B; positional coordinates and/or the wafer levels of the tamper candidates 410; and how the functional elements of the tamper candidates 410 interact with other functional elements at Level-A and Level-B of the Wafer Image, Level-A/B.

Returning again to the computer-implemented method 200 shown in FIG. 2, at block 206, the computing system 130 analyzes the tamper candidates 410 to determine whether or not the tamper candidates 410 are reference die tamper circuits that have been added to the reference die 142A during fabrication thereof without authorization. In accordance with aspects of the invention, additional analysis is applied to determine whether the tamper candidates are defects or tamper circuits. In some embodiments of the invention, the additional analysis is applied using machine learning algorithms (e.g., classifier system 500 and classifier 510 shown in FIG. 5) of the computing system 130. The machine learning algorithms have been trained to perform the task of determining (or "classifying") whether any of the tamper candidates 410 match a known working circuit. The tamper candidates 410 that the machine learning algorithm classifies as working circuits are also classified as reference die tamper circuits and the stored information of the tamper candidates 410 is updated to reflect the tamper candidates 410 that have been identified as reference die tamper circuits. Conversely, the tamper candidates 410 that the machine learning algorithm classifies as not being working circuits are classified as defects and the stored information of the tamper candidates 410 is updated to reflect the tamper candidates 410 that have been identified as defects.

In some embodiments of the invention, the additional analysis is applied by the computing system 130 controlling the HROIT 110 to move to the same location on a next die (e.g., any one of the dies 142 shown in FIG. 1) of the fabricated wafer 140 to determine whether or not the same tamper candidate 410 is at the same location on the next die. If the same tamper candidate 410 is at the same location on the next die, the tamper candidate 410 is determined to be a reference die tamper circuit, and the stored information of the tamper candidates 410 is updated to reflect the tamper candidates 410 that have been identified as reference die tamper circuits. If the same tamper candidate 410 is not at the same location on the next die, the tamper candidate 410 is determined to be a defect, and the stored information of the tamper candidates 410 is updated to reflect the tamper candidates 410 that have been identified as defects.

At block 208, the computing system 130 stores a set of the reference die tamper circuits determined at block 206, along with the information of the set of reference die tamper circuits.

At block 210, a next die of the fabricated wafer 140 is selected, wherein the next die is any one of the dies 142 of the fabricated wafer 140.

At block 212, the computing system 130 controls the LROIT 120 to compare the information of the reference die tamper circuits to the next die, wherein the next die is a die-under-analysis. Any match between the information of the reference die tamper circuits and the die-under-analysis can be flagged as a potential tamper circuit. At block 214, information of the set of reference die tamper circuits identified at block 212 is stored. The LROIT 120 has insufficient resolution to identify tamper circuits on its own. However, in accordance with aspects of the invention, the LROIT 120 is made capable of identifying tamper circuits though the novel "comparison" assistance defined at block 212.

At decision block 216, the computing system 130 controls the LROIT 120 to determine whether or not there is a next die 142 on the fabricated wafer 140 that has not been analyzed. If the answer to the inquiry at decision block 216 is yes, the computer-implemented method 200 returns to block 210 and applies the operations at blocks 210, 212, 214 to the next die. If the answer to the inquiry at decision block 216 is no, the computer-implemented method 200 moves to decision block 218 to determine whether or not there is a next fabricated wafer to analyze. If the answer to the inquiry at decision block 218 is yes, the computer-implemented method 200 returns to block 210 and applies the operations at blocks 210, 212, 214 to the next die on the next fabricated wafer. If the answer to the inquiry at decision block 218 is no, the computer-implemented method 200 moves to block 220 and ends.

Because the operations performed at blocks 210, 212, 214 are performed with the relatively fast LROIT 120, the inspection of one wafer can be completed as fast as about 30 minutes. In accordance with aspects of the invention, the computer-implemented method 200 uses a novel mix of the HROIT 110 and the LROIT 120. Because the slower high-resolution portion of the computer-implemented method 200 is applied to the reference die 142A, and because the slower high-resolution analysis results (i.e., the tamper candidates 410) are leveraged in the faster low-resolution portions of the computer-implemented method 200, the faster low-resolution portion of the computer-implemented method 200 can be applied to all other die 142 on the fabricated wafer 140, as well as any other wafer that follows the same IC design, thereby decreasing overall inspection time while providing high-resolution tamper circuit detection.

Additional details of machine learning techniques that can be used to implement aspects of the invention disclosed herein will now be provided. The various prediction and/or determination functionality of the processors described herein can be implemented using machine learning and/or natural language processing techniques. In general, machine learning techniques are run on so-called "neural networks," which can be implemented as programmable computers configured to run sets of machine learning algorithms and/or natural language processing algorithms. Neural networks incorporate knowledge from a variety of disciplines, including neurophysiology, cognitive science/psychology, physics (statistical mechanics), control theory, computer science, artificial intelligence, statistics/mathematics, pattern recognition, computer vision, parallel processing and hardware (e.g., digital/analog/VLSI/optical).

The basic function of neural networks and their machine learning algorithms is to recognize patterns by interpreting unstructured sensor data through a kind of machine perception. Unstructured real-world data in its native form (e.g., images, sound, text, or time series data) is converted to a numerical form (e.g., a vector having magnitude and direction) that can be understood and manipulated by a computer. The machine learning algorithm performs multiple iterations of learning-based analysis on the real-world data vectors until patterns (or relationships) contained in the real-world data vectors are uncovered and learned. The learned patterns/relationships function as predictive models that can be used to perform a variety of tasks, including, for example, classification (or labeling) of real-world data and clustering of real-world data. Classification tasks often depend on the use of labeled datasets to train the neural network (i.e., the model) to recognize the correlation between labels and data. This is known as supervised learning. Examples of classification tasks include identifying objects in images (e.g., stop signs, pedestrians, lane markers, etc.), recognizing gestures in video, detecting voices, detecting voices in audio, identifying particular speakers, transcribing speech into text, and the like. Clustering tasks identify similarities between objects, which the clustering task groups according to those characteristics in common and which differentiate them from other groups of objects. These groups are known as "clusters."

Figure 5:
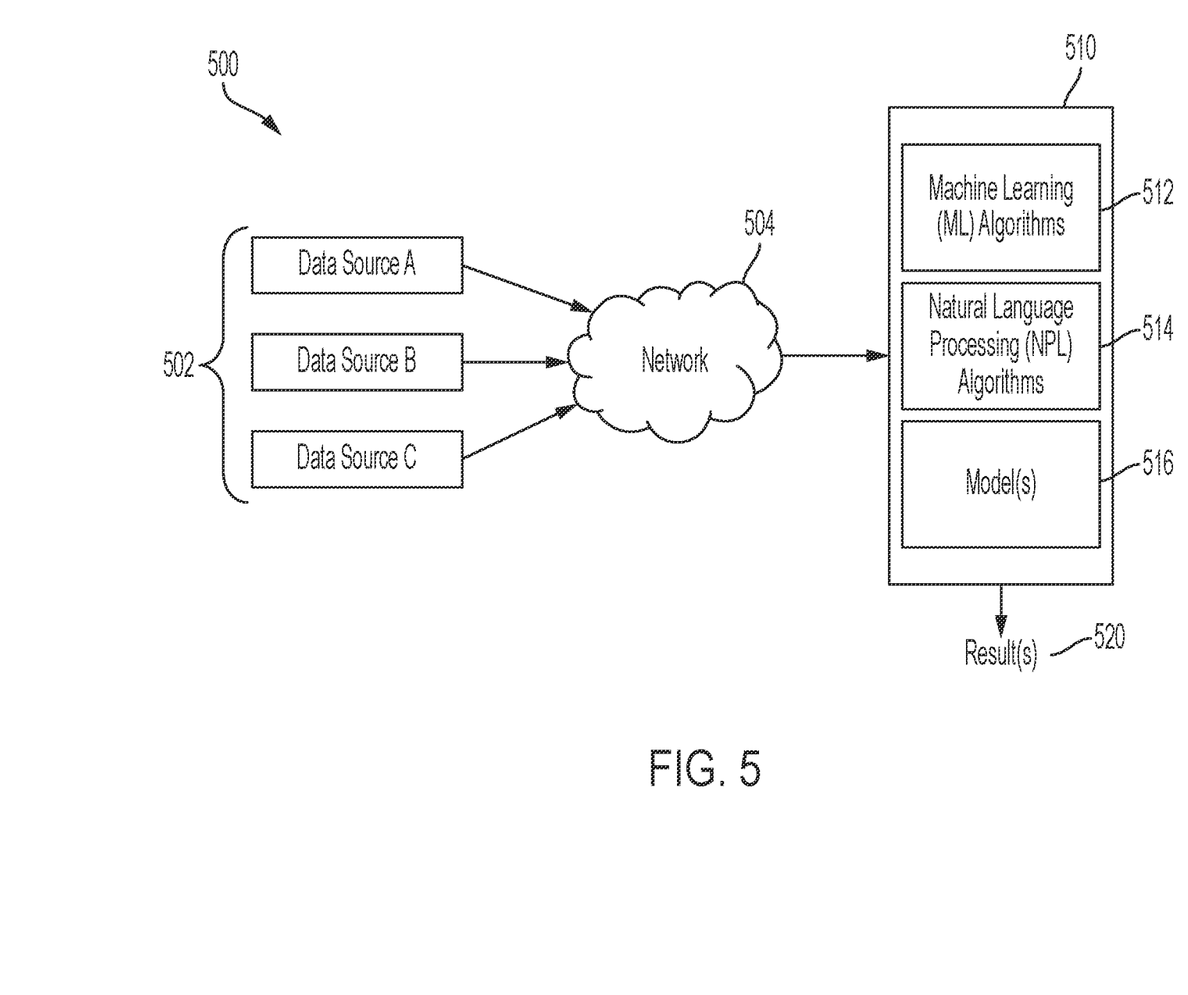
FIG. 5 depicts a machine learning system that can be utilized to implement aspects of the invention.

An example of machine learning techniques that can be used to implement aspects of the invention will be described with reference to FIGS. 5 and 6. FIG. 5 depicts a block diagram showing a classifier system 500 capable of implementing various predicting and determining aspects of the invention described herein. More specifically, the functionality of the classifier system 500 is used in embodiments of the invention to generate various models and/or sub-models that can be used to implement predicting and determining functionality in embodiments of the invention. The classifier system 500 includes multiple data sources 502 in communication through a network 504 with a classifier 510. In some aspects of the invention, the data sources 502 can bypass the network 504 and feed directly into the classifier 510. The data sources 502 provide data/information inputs that will be evaluated by the classifier 510 in accordance with embodiments of the invention. The data sources 502 also provide data/information inputs that can be used by the classifier 510 to train and/or update model(s) 516 created by the classifier 510. The data sources 502 can be implemented as a wide variety of data sources, including but not limited to, sensors configured to gather real time data, data repositories (including training data repositories), and outputs from other classifiers. The network 504 can be any type of communications network, including but not limited to local networks, wide area networks, private networks, the Internet, and the like.

The classifier 510 can be implemented as algorithms executed by a programmable computer such as the computing system 700 (shown in FIG. 7). As shown in FIG. 5, the classifier 510 includes a suite of machine learning (ML) algorithms 512; natural language processing (NLP) algorithms 514; and model(s) 516 that are relationship (or prediction) algorithms generated (or learned) by the ML algorithms 512. The algorithms 512, 514, 516 of the classifier 510 are depicted separately for ease of illustration and explanation. In embodiments of the invention, the functions performed by the various algorithms 512, 514, 516 of the classifier 510 can be distributed differently than shown. For example, where the classifier 510 is configured to perform an overall task having sub-tasks, the suite of ML algorithms 512 can be segmented such that a portion of the ML algorithms 512 executes each sub-task and a portion of the ML algorithms 512 executes the overall task. Additionally, in some embodiments of the invention, the NLP algorithms 514 can be integrated within the ML algorithms 512.

The NLP algorithms 514 include speech recognition functionality that allows the classifier 510, and more specifically the ML algorithms 512, to receive natural language data (text and audio) and apply elements of language processing, information retrieval, and machine learning to derive meaning from the natural language inputs and potentially take action based on the derived meaning. The NLP algorithms 514 used in accordance with aspects of the invention can also include speech synthesis functionality that allows the classifier 510 to translate the result(s) 520 into natural language (text and audio) to communicate aspects of the result(s) 520 as natural language communications.

The NLP and ML algorithms 514, 512 receive and evaluate input data (i.e., training data and data-under-analysis) from the data sources 502. The ML algorithms 512 include functionality that is necessary to interpret and utilize the input data's format. For example, where the data sources 502 include image data, the ML algorithms 512 can include visual recognition software configured to interpret image data. The ML algorithms 512 apply machine learning techniques to received training data (e.g., data received from one or more of the data sources 502) in order to, over time, create/train/update one or more models 516 that model the overall task and the sub-tasks that the classifier 510 is designed to complete.

Figure 6:
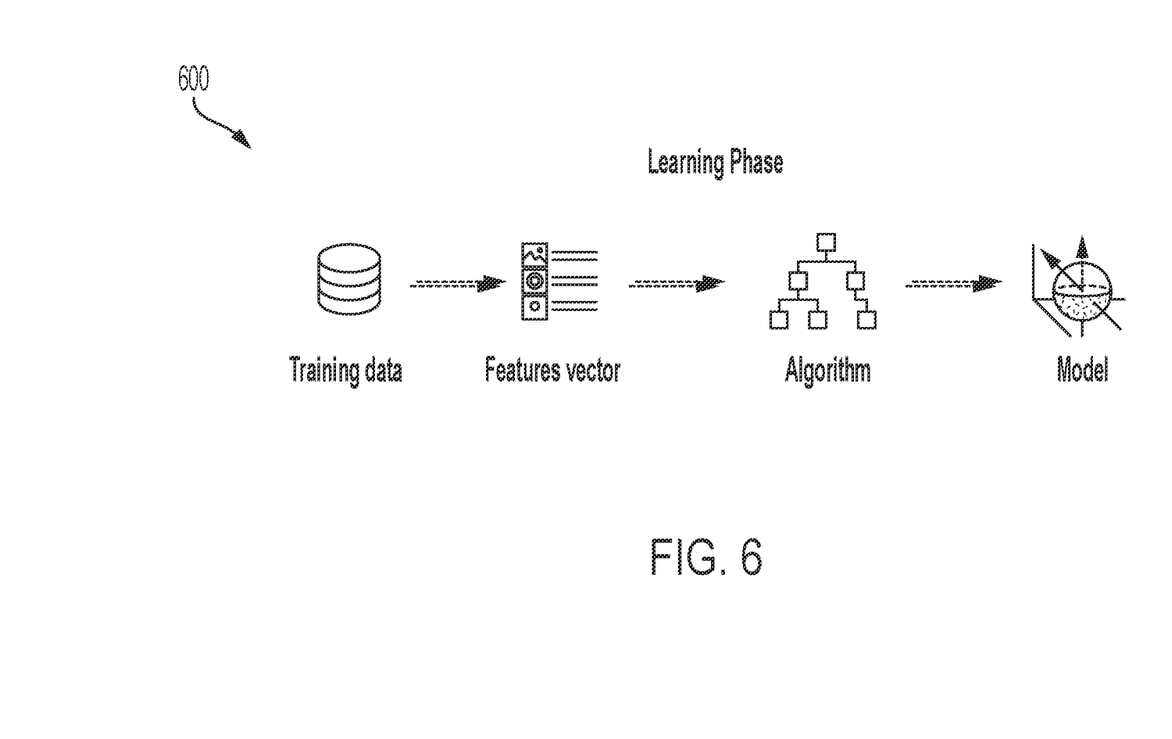
FIG. 6 depicts a learning phase that can be implemented by the machine learning system shown in FIG. 5.

Referring now to FIGS. 5 and 6 collectively, FIG. 6 depicts an example of a learning phase 600 performed by the ML algorithms 512 to generate the above-described models 516. In the learning phase 600, the classifier 510 extracts features from the training data and coverts the features to vector representations that can be recognized and analyzed by the ML algorithms 512. The features vectors are analyzed by the ML algorithm 512 to "classify" the training data against the target model (or the model's task) and uncover relationships between and among the classified training data. Examples of suitable implementations of the ML algorithms 512 include but are not limited to neural networks, support vector machines (SVMs), logistic regression, decision trees, hidden Markov Models (HMMs), etc. The learning or training performed by the ML algorithms 512 can be supervised, unsupervised, or a hybrid that includes aspects of supervised and unsupervised learning. Supervised learning is when training data is already available and classified/labeled. Unsupervised learning is when training data is not classified/labeled so must be developed through iterations of the classifier 510 and the ML algorithms 512. Unsupervised learning can utilize additional learning/training methods including, for example, clustering, anomaly detection, neural networks, deep learning, and the like.

When the models 516 are sufficiently trained by the ML algorithms 512, the data sources 502 that generate "real world" data are accessed, and the "real world" data is applied to the models 516 to generate usable versions of the results 520. In some embodiments of the invention, the results 520 can be fed back to the classifier 510 and used by the ML algorithms 512 as additional training data for updating and/or refining the models 516.

FIG. 7 illustrates an example of the computing system 700 that can be used to implement any of the computer-based components of the various embodiments of the invention described herein. The computing system 700 includes an exemplary computing device ("computer") 702 configured for performing various aspects of the content-based semantic monitoring operations described herein in accordance aspects of the invention. In addition to computer 702, exemplary computing system 700 includes network 714, which connects computer 702 to additional systems (not depicted) and can include one or more wide area networks (WANs) and/or local area networks (LANs) such as the Internet, intranet(s), and/or wireless communication network(s). Computer 702 and additional system are in communication via network 714, e.g., to communicate data between them.

Exemplary computer 702 includes processor cores 704, main memory ("memory") 710, and input/output component(s) 712, which are in communication via bus 703. Processor cores 704 includes cache memory ("cache") 706 and controls 708, which include branch prediction structures and associated search, hit, detect and update logic, which will be described in more detail below. Cache 706 can include multiple cache levels (not depicted) that are on or off-chip from processor 704. Memory 710 can include various data stored therein, e.g., instructions, software, routines, etc., which, e.g., can be transferred to/from cache 706 by controls 708 for execution by processor 704. Input/output component(s) 712 can include one or more components that facilitate local and/or remote input/output operations to/from computer 702, such as a display, keyboard, modem, network adapter, etc. (not depicted).

The methods and resulting structures described herein can be used in the fabrication of IC chips. The resulting IC chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes IC chips, ranging from toys and other low-end applications to advanced computer products having a display, a keyboard or other input device, and a central processor.

Various embodiments of the present invention are described herein with reference to the related drawings. Alternative embodiments can be devised without departing from the scope of this invention. Although various connections and positional relationships (e.g., over, below, adjacent, etc.) are set forth between elements in the following description and in the drawings, persons skilled in the art will recognize that many of the positional relationships described herein are orientation-independent when the described functionality is maintained even though the orientation is changed. These connections and/or positional relationships, unless specified otherwise, can be direct or indirect, and the present invention is not intended to be limiting in this respect. Accordingly, a coupling of entities can refer to either a direct or an indirect coupling, and a positional relationship between entities can be a direct or indirect positional relationship. As an example of an indirect positional relationship, references in the present description to forming layer "A" over layer "B" include situations in which one or more intermediate layers (e.g., layer "C") is between layer "A" and layer "B" as long as the relevant characteristics and functionalities of layer "A" and layer "B" are not substantially changed by the intermediate layer(s).

The following definitions and abbreviations are to be used for the interpretation of the claims and the specification. As used herein, the terms "comprises," "comprising," "includes," "including," "has," "having," "contains" or "containing," or any other variation thereof, are intended to cover a non-exclusive inclusion. For example, a composition, a mixture, process, method, article, or apparatus that comprises a list of elements is not necessarily limited to only those elements but can include other elements not expressly listed or inherent to such composition, mixture, process, method, article, or apparatus.

Additionally, the term "exemplary" is used herein to mean "serving as an example, instance or illustration." Any embodiment or design described herein as "exemplary" is not necessarily to be construed as preferred or advantageous over other embodiments or designs. The terms "at least one" and "one or more" are understood to include any integer number greater than or equal to one, i.e. one, two, three, four, etc. The terms "a plurality" are understood to include any integer number greater than or equal to two, i.e. two, three, four, five, etc. The term "connection" can include an indirect "connection" and a direct "connection."

References in the specification to "one embodiment," "an embodiment," "an example embodiment," etc., indicate that the embodiment described can include a particular feature, structure, or characteristic, but every embodiment may or may not include the particular feature, structure, or characteristic. Moreover, such phrases are not necessarily referring to the same embodiment. Further, when a particular feature, structure, or characteristic is described in connection with an embodiment, it is submitted that it is within the knowledge of one skilled in the art to affect such feature, structure, or characteristic in connection with other embodiments whether or not explicitly described.

For purposes of the description hereinafter, the terms "upper," "lower," "right," "left," "vertical," "horizontal," "top," "bottom," and derivatives thereof shall relate to the described structures and methods, as oriented in the drawing figures. The terms "overlying," "atop," "on top," "positioned on" or "positioned atop" mean that a first element, such as a first structure, is present on a second element, such as a second structure, wherein intervening elements such as an interface structure can be present between the first element and the second element. The term "direct contact" means that a first element, such as a first structure, and a second element, such as a second structure, are connected without any intermediary conducting, insulating or semiconductor layers at the interface of the two elements.

Spatially relative terms, e.g., "beneath," "below," "lower," "above," "upper," and the like, can be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the term "below" can encompass both an orientation of above and below. The device can be otherwise oriented (rotated 90 degrees or at other orientations) and the spatially relative descriptors used herein interpreted accordingly.

As previously noted herein, for the sake of brevity, conventional techniques related to semiconductor device and integrated circuit (IC) fabrication may or may not be described in detail herein. By way of background, however, a more general description of the semiconductor device fabrication processes that can be utilized in implementing one or more embodiments of the present invention will now be provided. Although specific fabrication operations used in implementing one or more embodiments of the present invention can be individually known, the described combination of operations and/or resulting structures of the present invention are unique. Thus, the unique combination of the operations described in connection with the fabrication of a semiconductor device according to the present invention utilize a variety of individually known physical and chemical processes performed on a semiconductor (e.g., silicon) substrate, some of which are described in the immediately following paragraphs.

In general, the various processes used to form a microchip that will be packaged into an IC fall into four general categories, namely, film deposition, removal/etching, semiconductor doping and patterning/lithography. Deposition is any process that grows, coats, or otherwise transfers a material onto the wafer. Available technologies include physical vapor deposition (PVD), chemical vapor deposition (CVD), electrochemical deposition (ECD), molecular beam epitaxy (MBE) and more recently, atomic layer deposition (ALD) among others. Removal/etching is any process that removes material from the wafer. Examples include etch processes (either wet or dry), chemical-mechanical planarization (CMP), and the like. Reactive ion etching (RIE), for example, is a type of dry etching that uses chemically reactive plasma to remove a material, such as a masked pattern of semiconductor material, by exposing the material to a bombardment of ions that dislodge portions of the material from the exposed surface. The plasma is typically generated under low pressure (vacuum) by an electromagnetic field. Semiconductor doping is the modification of electrical properties by doping, for example, transistor sources and drains, generally by diffusion and/or by ion implantation. These doping processes are followed by furnace annealing or by rapid thermal annealing (RTA). Annealing serves to activate the implanted dopants. Films of both conductors (e.g., polysilicon, aluminum, copper, etc.) and insulators (e.g., various forms of silicon dioxide, silicon nitride, etc.) are used to connect and isolate transistors and their components. Selective doping of various regions of the semiconductor substrate allows the conductivity of the substrate to be changed with the application of voltage. By creating structures of these various components, millions of transistors can be built and wired together to form the complex circuitry of a modern microelectronic device. Semiconductor lithography is the formation of three-dimensional relief images or patterns on the semiconductor substrate for subsequent transfer of the pattern to the substrate. In semiconductor lithography, the patterns are formed by a light sensitive polymer called a photoresist. To build the complex structures that make up a transistor and the many wires that connect the millions of transistors of a circuit, lithography and etch pattern transfer steps are repeated multiple times. Each pattern being printed on the wafer is aligned to the previously formed patterns and in that manner the conductors, insulators and selectively doped regions are built up to form the final device.

The present invention may be a system, a method, and/or a computer program product at any possible technical detail level of integration. The computer program product may include a computer readable storage medium (or media) having computer readable program instructions thereon for causing a processor to carry out aspects of the present invention.

The computer readable storage medium can be a tangible device that can retain and store instructions for use by an instruction execution device. The computer readable storage medium may be, for example, but is not limited to, an electronic storage device, a magnetic storage device, an optical storage device, an electromagnetic storage device, a semiconductor storage device, or any suitable combination of the foregoing. A non-exhaustive list of more specific examples of the computer readable storage medium includes the following: a portable computer diskette, a hard disk, a random access memory (RAM), a read-only memory (ROM), an erasable programmable read-only memory (EPROM or Flash memory), a static random access memory (SRAM), a portable compact disc read-only memory (CD-ROM), a digital versatile disk (DVD), a memory stick, a floppy disk, a mechanically encoded device such as punchcards or raised structures in a groove having instructions recorded thereon, and any suitable combination of the foregoing. A computer readable storage medium, as used herein, is not to be construed as being transitory signals per se, such as radio waves or other freely propagating electromagnetic waves, electromagnetic waves propagating through a waveguide or other transmission media (e.g., light pulses passing through a fiber-optic cable), or electrical signals transmitted through a wire.

Computer readable program instructions described herein can be downloaded to respective computing/processing devices from a computer readable storage medium or to an external computer or external storage device via a network, for example, the Internet, a local area network, a wide area network and/or a wireless network. The network may comprise copper transmission cables, optical transmission fibers, wireless transmission, routers, firewalls, switches, gateway computers and/or edge servers. A network adapter card or network interface in each computing/processing device receives computer readable program instructions from the network and forwards the computer readable program instructions for storage in a computer readable storage medium within the respective computing/processing device.

Computer readable program instructions for carrying out operations of the present invention may be assembler instructions, instruction-set-architecture (ISA) instructions, machine instructions, machine dependent instructions, microcode, firmware instructions, state-setting data, configuration data for integrated circuitry, or either source code or object code written in any combination of one or more programming languages, including an object oriented programming language such as Smalltalk, C++, or the like, and procedural programming languages, such as the "C" programming language or similar programming languages. The computer readable program instructions may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider). In some embodiments, electronic circuitry including, for example, programmable logic circuitry, field-programmable gate arrays (FPGA), or programmable logic arrays (PLA) may execute the computer readable program instruction by utilizing state information of the computer readable program instructions to personalize the electronic circuitry, in order to perform aspects of the present invention.

Aspects of the present invention are described herein with reference to flowchart illustrations and/or block diagrams of methods, apparatus (systems), and computer program products according to embodiments of the invention. It will be understood that each block of the flowchart illustrations and/or block diagrams, and combinations of blocks in the flowchart illustrations and/or block diagrams, can be implemented by computer readable program instructions.

These computer readable program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks. These computer readable program instructions may also be stored in a computer readable storage medium that can direct a computer, a programmable data processing apparatus, and/or other devices to function in a particular manner, such that the computer readable storage medium having instructions stored therein comprises an article of manufacture including instructions which implement aspects of the function/act specified in the flowchart and/or block diagram block or blocks.

The computer readable program instructions may also be loaded onto a computer, other programmable data processing apparatus, or other device to cause a series of operational steps to be performed on the computer, other programmable apparatus or other device to produce a computer implemented process, such that the instructions which execute on the computer, other programmable apparatus, or other device implement the functions/acts specified in the flowchart and/or block diagram block or blocks.

The flowchart and block diagrams in the Figures illustrate the architecture, functionality, and operation of possible implementations of systems, methods, and computer program products according to various embodiments of the present invention. In this regard, each block in the flowchart or block diagrams may represent a module, segment, or portion of instructions, which comprises one or more executable instructions for implementing the specified logical function(s). In some alternative implementations, the functions noted in the blocks may occur out of the order noted in the Figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

The descriptions of the various embodiments of the present invention have been presented for purposes of illustration but are not intended to be exhaustive or limited to the embodiments described. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments described herein.

What is claimed is:

1. A computer-implemented method comprising:
controlling, using a processor, a high-resolution optical inspection tool (HROIT) to identify a first instance of a reference die tamper circuit on a reference die of a wafer; and
controlling, using the processor, a low-resolution optical inspection tool (LROIT) to use the first instance of the reference die tamper circuit to determine that a second instance of the reference die tamper circuit is on a second die of the wafer.

2. The computer-implemented method of claim 1, wherein identifying the first instance of the reference die tamper circuit on the reference die of the wafer comprises identifying a difference between:
an IC design pattern of the wafer; and
the reference die of the wafer.

3. The computer-implemented method of claim 2, wherein the difference comprises a tamper candidate.

4. The computer-implemented method of claim 3, wherein identifying the first instance of the reference die tamper circuit on the reference die of the wafer further comprises analyzing the tamper candidate to determine that the tamper candidate comprises the reference die tamper circuit.

5. The computer-implemented method of claim 4, wherein analyzing the tamper candidate comprises determining that the tamper candidate comprises a working circuit.

6. The computer-implemented method of claim 5, wherein:
the processor comprises a machine learning algorithm; and
the machine learning algorithm is trained to perform a task comprising determining that the tamper candidate comprises the working circuit.

7. The computer-implemented method of claim 4, wherein:
analyzing the tamper candidate comprises determining that the tamper candidate is on any one of a plurality of die on the wafer; and
the plurality of die on the wafer do not include the reference die.

8. A computer system comprising a processor communicatively couple to memory, the processor configured to perform processor operations comprising:
controlling a high-resolution optical inspection tool (HROIT) to identify a reference die tamper circuit on a first instance of a reference die of a wafer; and
controlling a low-resolution optical inspection tool (LROIT) to use the first instance of the reference die tamper circuit to determine that a second instance of the reference die tamper circuit is on a second die of the wafer.

9. The computer system of claim 8, wherein identifying the first instance of the reference die tamper circuit on the reference die of the wafer comprises identifying a difference between:
an IC design pattern of the wafer; and
the reference die of the wafer.

10. The computer system of claim 9, wherein the difference comprises a tamper candidate.

11. The computer system of claim 10, wherein identifying the first instance of the reference die tamper circuit on the reference die of the wafer further comprises analyzing the tamper candidate to determine that the tamper candidate comprises the reference die tamper circuit.

12. The computer system of claim 11, wherein analyzing the tamper candidate comprises determining that the tamper candidate comprises a working circuit.

13. The computer system of claim 12, wherein:
the processor comprises a machine learning algorithm; and
the machine learning algorithm is trained to perform a task comprising determining that the tamper candidate comprises the working circuit.

14. The computer system of claim 11, wherein:
analyzing the tamper candidate comprises determining that the tamper candidate is on any one of a plurality of die on the wafer; and
the plurality of die on the wafer do not include the reference die.

15. A computer program product for controlling optical inspection tools, the computer program product comprising a computer readable program stored on a computer readable storage medium, wherein the computer readable program, when executed on a processor, causes the processor to perform a method comprising:
controlling a high-resolution optical inspection tool (HROIT) to identify a reference die tamper circuit on a first instance of a reference die of a wafer; and
controlling a low-resolution optical inspection tool (LROIT) to use the first instance of the reference die tamper circuit to determine that a second instance of the reference die tamper circuit is on a second die of the wafer.

16. The computer program product of claim 15, wherein identifying the first instance of the reference die tamper circuit on the reference die of the wafer comprises identifying a difference between:
an IC design pattern of the wafer; and
the reference die of the wafer.

17. The computer program product of claim 16, wherein the difference comprises a tamper candidate.

18. The computer program product of claim 17, wherein identifying the first instance of the reference die tamper circuit on the reference die of the wafer further comprises analyzing the tamper candidate to determine that the tamper candidate comprises the reference die tamper circuit.

19. The computer program product of claim 18, wherein:
analyzing the tamper candidate comprises determining that the tamper candidate comprises a working circuit;
the processor comprises a machine learning algorithm; and
the machine learning algorithm is trained to perform a task comprising determining that the tamper candidate comprises the working circuit.

20. The computer program product of claim 18, wherein:
analyzing the tamper candidate comprises determining that the tamper candidate is on any one of a plurality of die on the wafer; and
the plurality of die on the wafer do not include the reference die.

\* \* \* \* \*